United States Patent [19]
Waldo, III

[11] Patent Number: 5,548,625
[45] Date of Patent: Aug. 20, 1996

[54] METHOD FOR PARALLEL MULTIPLE FIELD PROCESSING IN X-RAY LITHOGRAPHY

[75] Inventor: Whitson G. Waldo, III, Hutto, Tex.

[73] Assignee: Motorola, Inc., Schaumburg, Ill.

[21] Appl. No.: 398,191

[22] Filed: Mar. 2, 1995

[51] Int. Cl.⁶ .............................. G21K 5/00; G21K 1/04
[52] U.S. Cl. ............................................ 378/34; 378/85
[58] Field of Search ............................ 378/34, 35, 145, 378/147, 85

[56] References Cited

U.S. PATENT DOCUMENTS

| | | | |
|---|---|---|---|
| 4,242,588 | 12/1980 | Silk et al. | 378/34 |
| 4,390,789 | 6/1983 | Smith et al. | 250/492.2 |
| 4,465,934 | 8/1984 | Westerberg et al. | 250/398 |
| 4,472,824 | 9/1984 | Buckley | 378/34 |
| 4,924,257 | 5/1990 | Jain | 355/53 |
| 5,115,456 | 5/1992 | Kimura et al. | 378/34 |
| 5,204,886 | 4/1993 | Dugdale | 378/34 |
| 5,249,215 | 9/1993 | Shimano | 378/147 |
| 5,268,951 | 12/1993 | Flamholz et al. | 378/34 |
| 5,301,124 | 4/1994 | Chan et al. | 364/490 |
| 5,394,451 | 2/1995 | Miyake et al. | 378/34 |

*Primary Examiner*—Don Wong
*Attorney, Agent, or Firm*—Minh-Hien N. Clark

[57] ABSTRACT

A method for performing multiple field parallel processing in x-ray lithography uses a coupled mirror assembly (30) and a coupled mask assembly (22) to define and print multiple fields (54 & 54') in one step. The coupled mirror assembly (30) has multiple mirrored surfaces (34). The coupled mask assembly (22) has as many masks (44) as there are mirrored surfaces (34). The number of masks in the mask assembly define the number image fields that can be printed in parallel during a single exposure step. Thus, the overall cycle time for lithographically exposing an entire semiconductor wafer surface is inversely proportional to the number of parallel image fields.

20 Claims, 3 Drawing Sheets

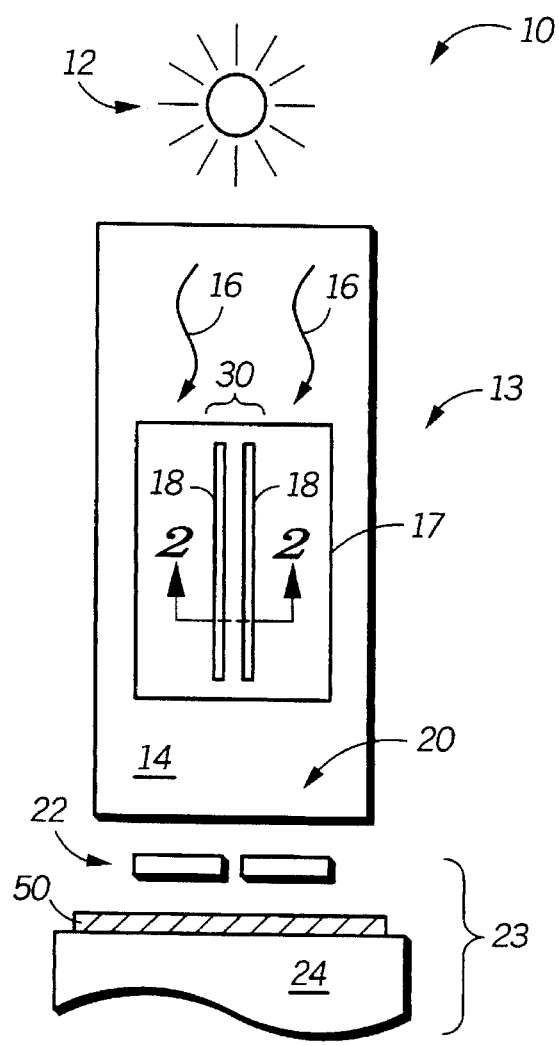
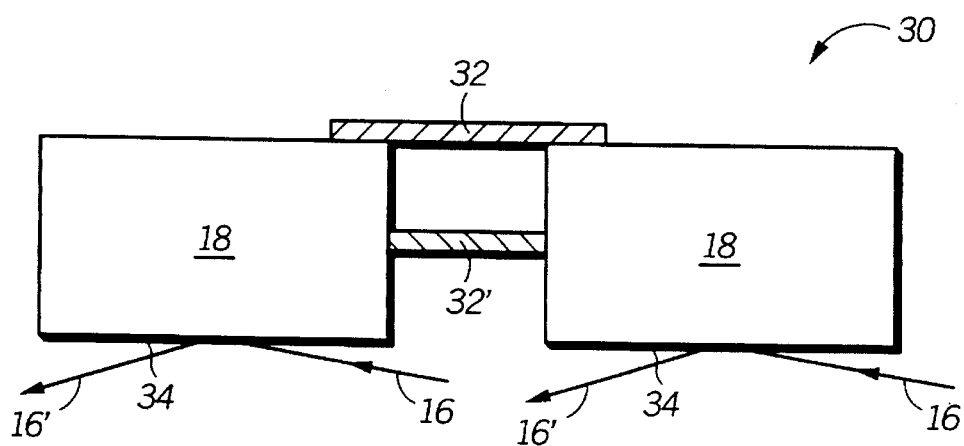
FIG.1
FIG.2

METHOD FOR PARALLEL MULTIPLE FIELD PROCESSING IN X-RAY LITHOGRAPHY

FIELD OF THE INVENTION

The present invention relates generally to a semiconductor process and more specifically to x-ray lithography.

BACKGROUND OF THE INVENTION

Lithography systems are used to expose patterns on semiconductor wafers in the fabrication of integrated circuit (IC) devices. Optical, electron (e-) beam, ion beam, and x-ray lithographic systems are examples of currently available tools. A typical system generally includes a primary exposure or radiation source, mask and substrate positioning systems, a projection system to illuminate and image the pattern present on the mask onto the substrate, and a control system. The intent is to selectively illuminate a wafer coated with a layer of radiation sensitive material to produce the desired circuit patterns, which will later be metallized or doped with impurities or otherwise activated during subsequent processing. Illumination can be by ultraviolet light, visible light, or other radiation, such as x-rays, e-beam or ion beam. Integrated circuit devices typically undergo numerous illumination steps and physical treatment steps during production. It should be noted that a single semiconductor wafer typically contains multiple IC devices. The entire wafer is processed by exposing a image field on a wafer, stepping to the next image field, and repeating the process. This method is referred to as serial lithographic processing since the many image fields of the wafer are exposed/printed serially, one by one, even though all the pixels in the image field are exposed simultaneously per exposure.

An image field may contain multiple IC devices if the device size is small as compared to the image field. Thus, a single exposure may print multiple devices since all the pixels in the image field are exposed simultaneously, and the wafer is then stepped to the next field for the imaging process to be repeated. This process includes both serial and parallel lithographic processing in the sense that circuitry for multiple IC devices are printed per exposure, but the exposure is limited to a single field for every step. The number of devices on a wafer that can be imprinted in a single step is limited by the size of the image field in this method.

A currently available maximum lens field is 20 mm by 20 mm for an optical lithographic system. Thus, if the desired device size is 20 mm by 20 mm, only one device can be exposed for each image field, while for a smaller device size, such as 1 mm by 1 mm, 400 devices can be printed in a single step. Each exposure step is a parallel operation where the entire field receives flood exposure by the light source and the imaging information from the mask is transferred directly onto the target wafer area. Thus, if the image field could be enlarged to equal the size of the target wafer, then a batch lithographic process could be realized, wherein the entire wafer is exposed in one step. However, the lens technology is highly advanced, and it is not expected that current technology will produce fields significantly larger than those available today. On the other hand, wafer diameters are expected to grow as that technology improves, which means that batch lithographic processing will not be a viable solution.

Additionally, the current trend is for the individual bits on IC devices to have half-micron and quarter-micron dimensions, with the push for even smaller dimensions. This means that lithographic equipment used for imaging these patterns necessarily require higher and higher resolutions which could lead to use of technologies other than optical lithographic systems. Simultaneously, the actual physical sizes of the IC devices are increasing due to more integrated operations on a single device. The increased IC chip sizes is one driving force that is pushing the semiconductor industry to move toward larger sized wafers, beyond the 6-inch (150 mm) and 8-inch (200 mm) wafers that have been the norm up to now. However, with larger sized wafers, more serial imaging steps are required to pattern the entire wafer as compared to the smaller sized wafers due to the increased surface area of the wafer. For example, the increased process time required for larger wafers is proportional to wafer area, so that it takes approximately 2.5 times longer to expose an 8-inch wafer as compared to a 5-inch wafer. This ratio increases with increasing wafer diameters, which is undesirable since industry is in the process of developing 12-inch, 16-inch, and 20-inch wafer technologies. Keeping in mind that a finished IC device may comprise 20 or more layers that have to be lithographically imaged, any reduction in lithographic cycle time can significantly decrease the processing costs of the wafers especially as volume production increases.

E-beam and ion beam lithography have addressed this problem with the use of multiple fields in order to decrease the cycle time. However, the methods of forming the multiple fields in these technologies require means for breaking up charged particle beams in a parallel manner through the use of electric fields and then focusing these beams onto the semiconductor wafer. This technology is wholly inapplicable with x-ray lithography which uses photon beams and physical mirrors for bending and reflecting light. Yet, heavy emphasis is being placed on developing x-ray lithography for the processing of newer more complex IC devices due to the high resolution achievable with x-ray wavelengths. Thus, it is desirable to find a method for reducing lithographic cycle time using x-ray lithography.

BRIEF DESCRIPTION OF THE DRAWINGS

FIG. 1 illustrates a schematic of a portion of an x-ray lithographic system in accordance with the invention.

FIG. 2 illustrates, in cross-section, a schematic of a coupled mirror assembly for use in the system of FIG. 1.

DETAILED DESCRIPTION OF A PREFERRED EMBODIMENT

Figure 3:
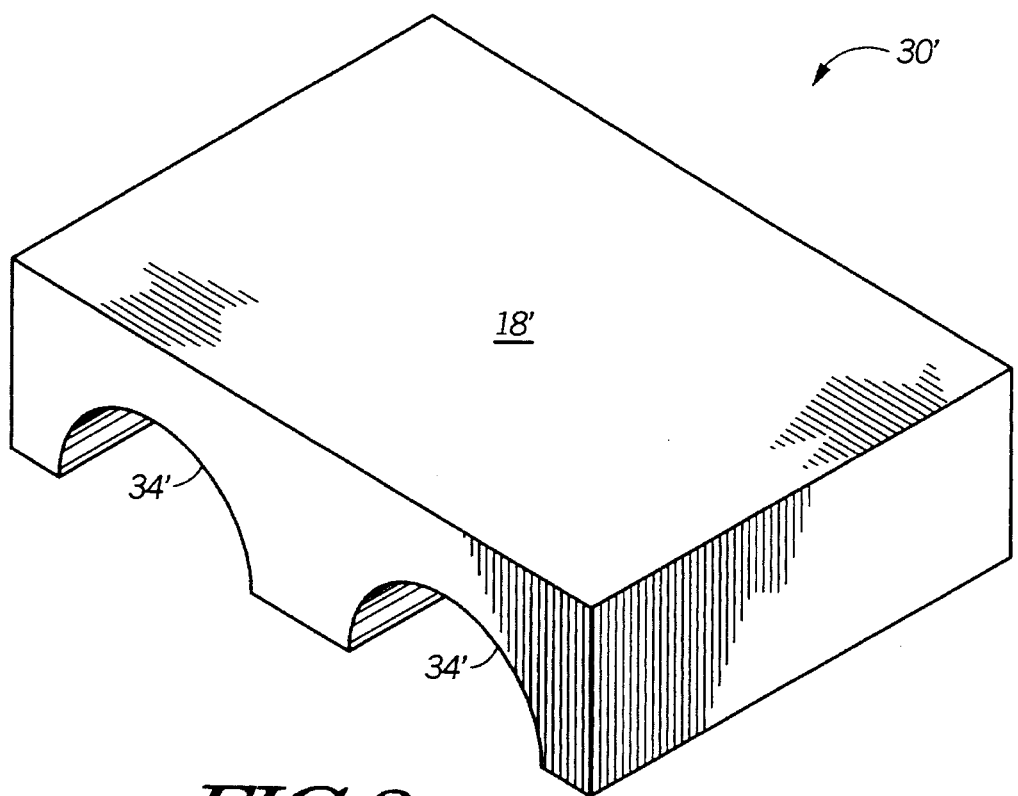
FIG. 3 illustrates, in a three-dimensional view, a schematic of a monolithic mirror assembly as an alternative to the coupled mirror assembly of FIG. 2.

The present invention addresses the problem of long cycle time due to single field x-ray lithographic processing by providing a method in which multiple fields can be imaged simultaneously in x-ray lithography, hence reducing overall cycle time by decreasing the number of steps required to print an entire semiconductor wafer. In general, the x-ray lithographic equipment is modified to house a mirror assembly comprising at least two mirrored surfaces so that multiple fields can be realized. Thus, a method of the invention utilizes a radiation source to generate the x-rays which are then projected into an ultra high vacuum (UHV) pipe. The mirror assembly is contained and supported within the UHV pipe such that the multiple mirrored surfaces collect the photons from the x-rays and process the light in parallel to produce multiple light beams, each of which has a finite horizontal and vertical extent. Each of the processed light beams exit through a beryllium exit window. External to the UHV pipe is a mask assembly which contains as many masks as there are mirrored surfaces in the mirror assembly. The number of masks define the number of fields that will be simultaneously imaged onto a target semiconductor wafer. The wafer is supported by a stepper which is standard equipment with any x-ray lithography system. By using a combination of a mirror assembly and a mask assembly, each having multiple mirrors and masks, respectively, it is possible to expose multiple image fields in parallel in x-ray lithography. The number of steps required to print an entire wafer is inversely proportional to the number of fields printed in each step.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

FIG. 1 illustrates a schematic of an x-ray lithographic system 10 which is a typical arrangement for purposes of the invention. Standard x-ray lithographic equipment is well known in the art. The system 10 includes an x-ray source 12, a beamline 13, and an aligner station 23. In a typical system, the beamline 13 may be 30 feet long as it extends between the x-ray source 12 and the aligner station 23. The x-ray source 12, schematically represented in FIG. 1, could be a point source but is preferably a synchrotron which is a known device for accelerating charged particles in a vacuum. These charged particles orbit in a vacuum in a path defined by magnetic fields, and as the particles bend in their orbital path, they emit photons 16 into a first end of the beamline 13. The beamline 13 includes an elongated tube 14 which is suitably evacuated. Tube 14 is often referred to as an ultra high vacuum (UHV) pipe because it is typically maintained at $10^{-10}$–$10^{-11}$ torr. Within the tube 14 is a bird's eye view of a mirror assembly 30, which is used to reflect the stream of radiated photons 16 into a particular format, utilizing a coating that is reflective to x-rays. A typical reflective coating is gold, but other materials, such as silicon carbide may also be used as a reflector. The length of the reflective surfaces of mirror assembly 30 is positioned along the length the elongated tube 14. The surfaces themselves are labeled as surfaces 34 in the cross-sectional view of mirror assembly 30 in FIG. 2 and as surfaces 34' in the three dimensional view of mirror assembly 30' in FIG. 3. The mirror assembly 30 is one of the essential elements that enables one to practice the present invention. At this point, it is important to note that the mirrors 18 are coupled together, although not specifically shown because the method of coupling the mirrors 18 can vary significantly, to form the mirror assembly 30. More detailed discussion of this mirror assembly will follow with reference to FIGS. 2 and 3. The mirror assembly 30 is depicted as being supported by some mechanical means 17 with the tube 14. The mechanical support 17 is equipment dependent and is not of particular relevance to the discussion of the present invention. It is sufficient to note that the mirror assembly 30 requires support within the system 10 and that any equipment manufacturer is capable of producing such a support.

The radiated photons 16 at the first end of the elongated tube 14 travel within the tube and graze the mirrored surfaces of the mirror assembly, which act to collimate-the photons into x-ray beams. Since the length of the mirrored surfaces is positioned along the length of the elongated tube, the grazing angles of the photons are small so as to allow the beams to be reflected off the mirrored surfaces to continue traveling along the length of the elongated tube 14. The reflected beams, however, have been collimated into a particular format determined by the shape of the mirrored surfaces-hence the term collimating mirror as is commonly used in the art. The x-ray beams, after being reflected off the mirror assembly 30, continue through the beamline 13 and exit as a set of physically separate beams through an exit window 20 at a second end of the beamline 13. The exit window 20 is typically a beryllium membrane employed to withstand the pressure difference between the ultra high vacuum of the beamline and the atmospheric pressure of the aligner station 23. The exit window 20 may have multiple windows, side-by-side, with some finite separation distance between them or it may be an elongated single beryllium membrane. However, configured, each exiting x-ray beam must pass through a suitable portion of the exit window.

The x-ray beams travel through a mask assembly 22, having multiple masks, to collect the information on the masks that define the circuitry to be imprinted on a semiconductor wafer surface. This mask assembly 22 is another essential element that enables one to practice the present invention, and will thus be discussed in more detail with reference to FIG. 4. A target semiconductor wafer 50 is suitably and removably supported in the aligner station 23 on a stage 24. The stage 24 is generally capable of six degrees of freedom of motion so that wafer can be properly aligned and focused with respect to the mask assembly. The wafer 50 is provided with a layer of light sensitive material, for example, photoresist. The information from each mask in the mask assembly is simultaneously imprinted onto the surface of the target wafer such that multiple fields are printed in one step, thus enabling a true parallel x-ray lithographic process.

FIGS. 2 and 3 illustrate two possible configurations for the mirror assembly mentioned above. In FIG. 2, a cross-sectional schematic of mirror assembly 30 is depicted, where two conventional mirrors 18 are coupled together with hardware 32 and 32'. It should be understood that this schematic is oversimplified for ease of illustration and clarity, because an actual coupled mirror assembly may be composed of numerous mechanical parts and linkages. It is only important that the mirrors are linked together so that multiple x-ray beams are formed from an incoming stream of photons, and that the path of the x-ray beams through the beamline is controlled by the reflection angle provided by the multiple mirrors. The mirrors 18 are illustrated to have flat surfaces 34, but other surface shapes, such as curved shapes, can also be used. The x-ray beams would reflect off the surface 34 and then exit through the exit window 20 of FIG. 1.

FIG. 3 illustrates an alternative configuration for the mirror assembly. In this figure, the mirror assembly 30' is a monolithic mirror having multiple collimating mirrored surfaces 34'. The collimating mirrored surfaces 34', where the x-ray beams would reflect from, is shown to be toroidal-shaped to illustrate that mirrored surfaces can be something other than flat. In fact, the mirrored surfaces may be circular, parabolic, cylindrical, polynomial or otherwise curved. An actual physical separation between the two mirrored surfaces 34' is required, because some divergence angle between the two x-ray beams is desired to print different fields on the target wafer. Otherwise, the two beams may be too close together and effectively form a single beam and image field which would defeat the purpose of the present invention which is to provide multiple fields for parallel printing. It should be noted that practicing the present invention is in no way limited to only two mirrors or two fields, although only two have been illustrated. A greater number of mirrors may be possible, depending on the size of the wafer to be processed. For example, it may be more practical to have three or four mirrors in the mirror assembly when the wafer size reaches the 20-inch level, while having two mirrors is sufficient for an 8-inch wafer.

Figure 4:
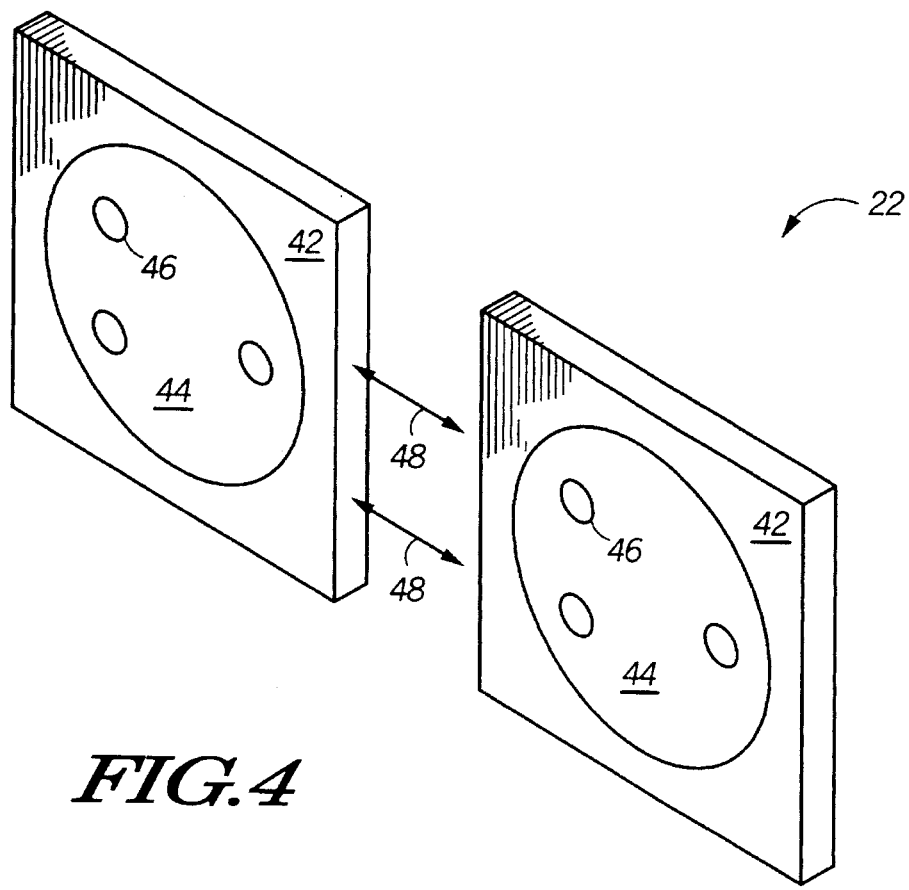
FIG. 4 illustrates, in a three-dimensional view, a schematic of a coupled mask stage for use in the system of FIG. 1.

FIG. 4 illustrates, in a three-dimensional view, a schematic for the coupled mask assembly 22 of FIG. 1. The coupled mask assembly 22 is shown here as a dual mask assembly since there are two mirrors provided in the mirror assembly 30 of FIGS. 1–3. The mask assembly 22 is schematically illustrated to be composed of stages 42, each for holding a mask 44. The masks 44 may be coupled together by way of interferometric means 48, for example. The interferometers 48 control the spacing between the two masks in the mask assembly. Alternatively, the masks may be physically coupled together by some physical reference, such as a calibrated bar or shim or other mechanical means. Another coupling alternative is use of electronic means for coupling. The spacing between the masks is not necessarily the same as the spacing between the mirrored surfaces (described above) due to the horizontal divergence of the x-ray beams as they reflect off the mirrored surfaces. It is necessary to couple the masks together in the mask assembly to control and fix the separation distance between multiple image fields for parallel processing.

In practice, it may be desirable to use a first mask for both focusing and alignment while the second mask is used solely for focusing. Focusing is the process of setting the gap spacing between the mask and the target wafer. Alignment is the translational and rotational referencing in the X- and Y-directions between the masks and the wafer. The dual masks may be coupled together with interferometers which control the distance between the two masks so that alignment is done with one mask while the second mask is referenced to the first for translation and rotation. Alternatively, both masks could be used for alignment and focusing so that no referencing of one mask to the other mask is required. The holes 46 in the mask 44 are illustrated since they could be required for the focusing and alignment operations. Both focusing and alignment steps are known operations to one of ordinary skill practicing in this art. It should be noted that focusing is required for every exposure step but alignment is not, although alignment for every exposure step is also acceptable practice.

Figure 5:
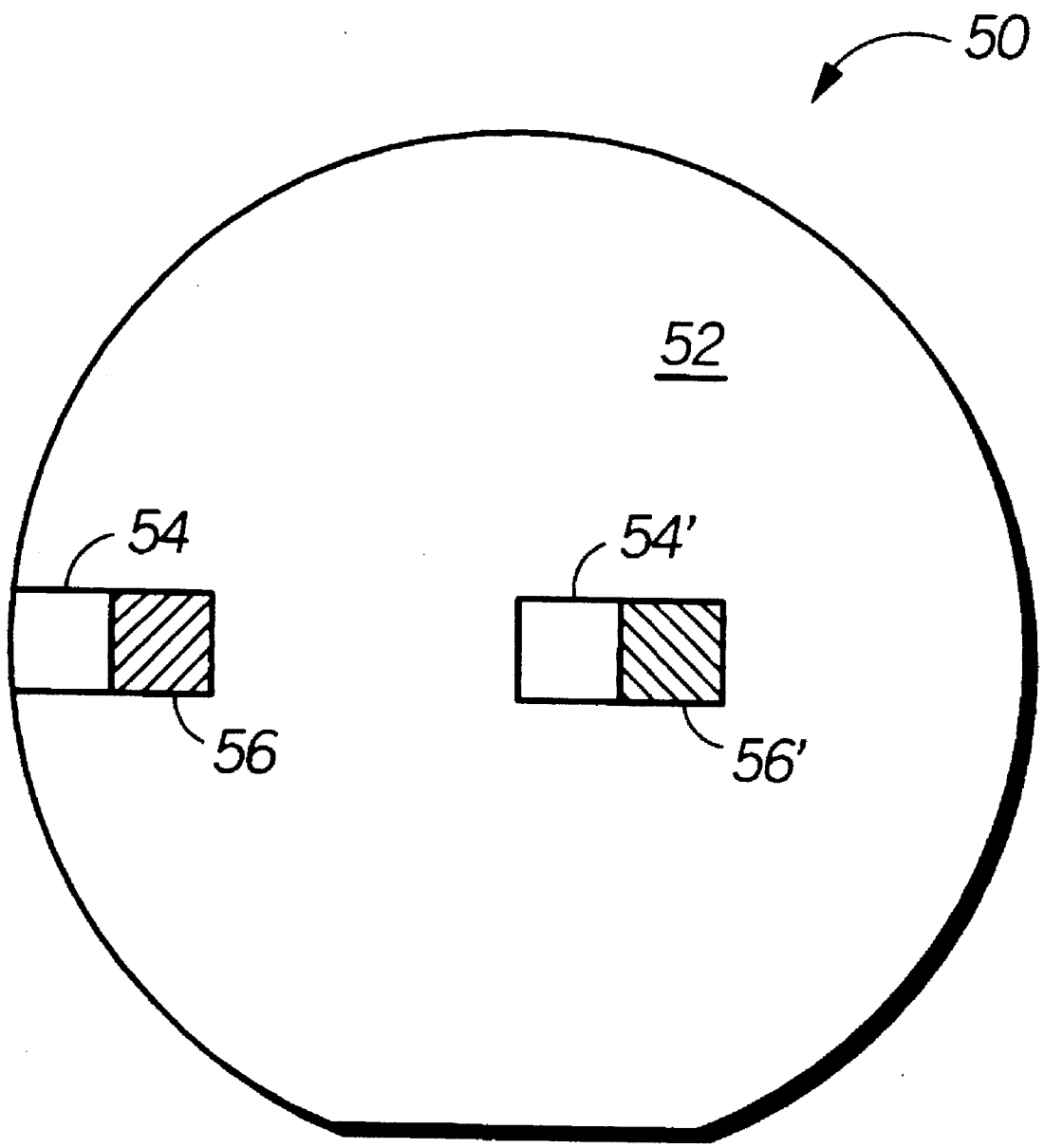
FIG. 5 illustrates steps in which a semiconductor wafer is patterned in accordance with the invention.

FIG. 5 illustrates steps in which the target semiconductor wafer 50 is printed in accordance with the present invention. The surface 52 of the wafer is lithographically patterned by the following illustrative sequence. In a first step, image fields 54 and 54', as defined by the mask assembly, are exposed in parallel onto the surface using the method and equipment described above. The physical separation between the image fields 54 and 54' is constrained by the spacing between the mirrored surfaces and by how closely the mask stages may be coupled together. Then, the stage (shown in FIG. 1 as part of the alignment station) jogs the wafer to the next position and image fields 56 and 56' are exposed in parallel. It is envisioned that separate exposure shutters may be desirable to provide more accurate control during the exposure step by providing individual controls for each x-ray beam. The stage would continue to jog to the next position so that two fields are printed for every step until the entire wafer surface is printed. By printing two fields in parallel for every print step, one may reduce the overall lithographic cycle time to approximately ½ of what is currently being done. It is understood, however, that the number of image fields printed per step is determined by the number of mirrors and masks provided in the system. Thus, if the mirror assembly and mask assembly each contained three mirrors and masks, respectively, then three image fields would be printed in parallel, thus reducing the time required to print the wafer to approximately ⅓ as compared to current serial processing. Some exposures might use only one of the fields for printing to more completely print all of the possible area on the wafer.

The foregoing description and illustrations contained herein demonstrate many of the advantages associated with the present invention. In particular, it has been revealed that by providing a mirror assembly having multiple mirrors and a mask assembly having multiple masks, it is possible to perform parallel x-ray lithography where multiple fields can be simultaneously printed on a wafer surface to reduce the total number of steps required to pattern the entire wafer. Moreover, the equipment modifications required to accommodate the larger assemblies are well within the capabilities of the equipment manufacturers. Yet another advantage is that the present invention effectively combines the superior resolution afforded by x-ray lithography over the other types of lithography with a method to increase the throughput of the process for a manufacturing environment where cycle time translates into money. Additionally, using multiple masks means that smaller mask fields may be used without a detrimental effect on cycle time, which is advantageous because an x-ray mask could have more defects as the mask size increases. Thus, using multiple smaller masks to expose different areas on the wafer makes the defectivity control much easier.

Thus it is apparent that there has been provided, in accordance with the invention, a method for multiple fields parallel x-ray lithography that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the mirror assembly may combine both curved and flat mirrors for use in the beamline optical system instead of being exclusively one or the other. Additionally, the mask assembly may be a monolithic assembly instead of being separate masks coupled together. It is also important to note that the present invention is not limited in any way to printing only two fields at a time, because a larger number of fields may be simultaneously printed depending on the number of mirrors and masks provided in the mirror assembly and mask assembly. Furthermore, there is no requirement that the sequential exposure steps be limited to exposing an adjacent and abutting area on the wafer surface since a more time efficient pattern may depend on the size and shape of the wafer to be printed. Therefore, it is intended that this invention encompasses all such variations and modifications falling within the scope of the appended claims.

I claim:

1. A method for performing parallel multiple field processing in x-ray lithography comprising the steps of:

a) placing a semiconductor wafer on a support stage for holding the semiconductor wafer;

b) providing an x-ray source;

c) providing a mirror assembly containing at least two mirrored surfaces each having a length;

d) providing means for containing the mirror assembly, wherein the length of the at least two mirrored surfaces is positioned along a length of the means for containing the mirror assembly to act as collimating mirrors;

e) providing a mask assembly containing a same number of masks as mirrored surfaces in the mirror assembly, wherein the mask assembly maintains a first fixed separation distance between each mask for forming multiple and separate image fields;

f) aligning the semiconductor wafer with respect to the mask assembly;

g) focusing a first surface portion of the semiconductor wafer with respect to the mask assembly;

h) exposing the first surface portion of the semiconductor wafer to at least two exiting x-ray beams formed by the collimating mirrors which collimate photons emitted by the x-ray source which is projected into a first end of the means for containing the mirror assembly such that the at least two exiting x-ray beams are collimated and reflected off the at least two mirrored surfaces to travel through the length of the means for containing the mirror assembly to exit a second end of the means for containing the mirror assembly, wherein the at least two mirrored surfaces form the at least two exiting x-ray beams having a second fixed separation distance between the at least two exiting x-ray beams such that each of the at least two exiting x-ray beams travels through a separate mask of the mask assembly to print the multiple and separate image fields on the semiconductor wafer; and i) stepping to a next surface portion of the semiconductor wafer and repeating steps (g) through (i) until all desired surface portions of the semiconductor wafer are exposed.

2. The method of claim 1, wherein the step of placing the semiconductor wafer is further characterized as placing a wafer having a diameter of at least 200 millimeters.

3. The method of claim 1, wherein the step of providing the means for containing the mirror assembly provides an evacuated tube having a multiple beryllium exit window at the second end of the means for containing the mirror assembly.

4. The method of claim 1, wherein the step of providing the mirror assembly comprises providing a monolithic mirror having multiple mirrored surfaces having a shape selected from a group consisting of: flat, parabolic, circular, toroidal, cylindrical, and polynomial.

5. The method of claim 1, wherein the step of providing the mirror assembly comprises providing multiple separate mirrors mechanically coupled together and having a fixed physical separation between each mirror, wherein each mirror has a surface having a shape selected from a group consisting of: flat, parabolic, circular, toroidal, cylindrical, and polynomial.

6. The method of claim 1, wherein the step of providing the mask assembly provides multiple masks coupled together with means for coupling selected from a group consisting of: an interferometer, physical means, and electronic means.

7. The method of claim 1, wherein the step of providing the mask assembly provides a first mask used for aligning and focusing, and a second mask used only for focusing.

8. The method of claim 1, wherein the step of providing the mask assembly provides masks that are each used for aligning and focusing.

9. A method for performing parallel multiple field processing in x-ray lithography comprising the steps of:

a) placing a semiconductor wafer on a support stage for holding the semiconductor wafer;

b) providing an x-ray source;

c) providing a monolithic mirror assembly containing at least two mirrored surfaces each having a length;

d) providing an elongated tube, suitably evacuated, for containing the monolithic mirror assembly, wherein the length of the at least two mirrored surfaces is positioned along a length of the elongated tube to act as collimating mirrors;

e) providing, external to the elongated tube but aligned thereto, a mask assembly containing a same number of masks as mirrored surfaces in the monolithic mirror assembly, wherein the mask assembly maintains a first fixed separation distance between each mask for forming multiple and separate image fields;

f) aligning the semiconductor wafer with respect to the mask assembly;

g) focusing a first surface portion of the semiconductor wafer with respect to the mask assembly;

h) exposing the first surface portion of the semiconductor wafer to at least two exiting x-ray beams formed by the collimating mirrors which collimate photons emitted by the x-ray source which is projected into a first end of the elongated tube for containing the monolithic mirror assembly such that the at least two exiting x-ray beams are collimated and reflected off the at least two mirrored surfaces to travel through the length of the elongated tube to exit a second end of the elongated tube for containing the monolithic mirror assembly, wherein the at least two mirrored surfaces form the at least two exiting x-ray beams having a second fixed separation distance between the at least two exiting x-ray beams such that each of the at least two exiting x-ray beams travels through a separate mask of the mask assembly to print the multiple and separate image fields on the semiconductor wafer; and i) stepping to a next surface portion of the semiconductor wafer and repeating steps (g) through (i) until all desired surface portions of the semiconductor wafer are exposed.

10. The method of claim 9, wherein the step of placing the semiconductor wafer is further characterized as placing a wafer having a diameter of at least 200 millimeters.

11. The method of claim 9, wherein the step of providing the mask assembly provides multiple masks coupled together with means for coupling selected from a group consisting of: an interferometer, physical means, and electronic means.

12. The method of claim 9, wherein the step of providing the monolithic mirror assembly provides mirrored surfaces having a shape selected from a group consisting of: flat, parabolic, circular, toroidal, cylindrical, and polynomial.

13. The method of claim 9, wherein the step of providing the elongated tube for containing the monolithic mirror assembly comprises providing an ultra high vacuum tube, evacuated to a pressure of approximately in a range of $10^{-10}$ to $10^{-11}$ torr.

14. The method of claim 13, wherein the step of providing the elongated tube further provides a multiple beryllium exit window at the second end of the elongated tube.

15. The method of claim 9, wherein the step of providing the mask assembly provides a first mask used for aligning and focusing, and a second mask used only for focusing.

16. A method for performing parallel multiple field processing in x-ray lithography comprising the steps of:

a) placing a semiconductor wafer on a support stage for holding the semiconductor wafer;

b) providing an x-ray source;

c) providing a coupled mirror assembly containing at least two mirrors each having a length;

d) providing an elongated tube, suitably evacuated, for containing the coupled mirror assembly, wherein the length of the at least two mirrors is positioned along a length of the elongated tube to act as collimating mirrors;

e) providing, external to the elongated tube but aligned thereto, a mask assembly containing a same number of masks as mirrors in the coupled mirror assembly, wherein the mask assembly maintains a first fixed separation distance between each mask for forming multiple and separate image fields;

f) aligning the semiconductor wafer with respect to the mask assembly;

g) focusing a first surface portion of the semiconductor wafer with respect to the mask assembly;

h) exposing the first surface portion of the semiconductor wafer to at least two exiting x-ray beams formed by the collimating mirrors which collimate photons emitted by the x-ray source which is projected into a first end of the elongated tube for containing the coupled mirror assembly such that the at least two exiting x-ray beams are collimated and reflected off the at least two mirrors to travel through the length of the elongated tube to exit a second end of the elongated tube for containing the coupled mirror assembly, wherein the at least two mirrors form the at least two exiting x-ray beams having a second fixed separation distance between the at least two exiting x-ray beams such that each of the at least two exiting x-ray beams travels through a separate mask of the mask assembly to print the multiple and separate image fields on the semiconductor wafer; and i) stepping to a next surface portion of the semiconductor wafer and repeating steps (g) through (i) until all desired surface portions of the semiconductor wafer are exposed.

17. The method of claim 16, wherein the step of placing the semiconductor wafer is further characterized as placing a wafer having a diameter of at least 200 millimeters.

18. The method of claim 16, wherein the step of providing the coupled mirror assembly comprises providing multiple separate mirrors mechanically coupled together to maintain a fixed physical separation between each mirror.

19. The method of claim 16, wherein the step of providing the coupled mirror assembly provides mirrors having a shape selected from a group consisting of: flat, parabolic, circular, toroidal, cylindrical, and polynomial.

20. The method of claim 16, wherein the step of providing a mask assembly provides multiple masks coupled together with means for coupling selected from a group consisting of: an interferometer, physical means, and electronic means.

\* \* \* \* \*